(12) United States Patent (10) Patent No.: US 7,791,015 B2
Chen et al. (45) Date of Patent: Sep. 7, 2010

(54) MOTION-DETECTING MODULE FOR COMBINING A LIGHT-EMITTING FUNCTION AND A LIGHT-SENSING FUNCTION TOGETHER

(75) Inventors: Jau-Yu Chen, Taipei (TW); Kun-Hsun Lee, Taipei (TW)

(73) Assignee: Lite-On Semiconductor Corp., Taipei Hsien (TW)

( * ) Notice: Subject to any disclaimer, the term of this patent is extended or adjusted under 35 U.S.C. 154(b) by 0 days.

(21) Appl. No.: 12/149,797

(22) Filed: May 8, 2008

(65) Prior Publication Data

US 2009/0278035 A1 Nov. 12, 2009

(51) Int. Cl.
*H01J 5/02* (2006.01)
*G06M 7/00* (2006.01)

(52) U.S. Cl. ...................... 250/239; 250/221

(58) Field of Classification Search ............... 250/221, 250/239, 227.11–227.24, 231.1, 222.1, 234, 250/235, 208.1, 216; 345/157, 163, 166
See application file for complete search history.

(56) References Cited

U.S. PATENT DOCUMENTS

| | | | |
|---|---|---|---|
| 6,835,923 B2 * | 12/2004 | Hamalainen et al. | 250/227.11 |
| 7,034,278 B2 * | 4/2006 | Tschirren et al. | 250/221 |
| 7,068,257 B1 * | 6/2006 | Bohn | 345/166 |
| 7,321,359 B2 * | 1/2008 | Xie et al. | 345/163 |
| 2007/0188457 A1 * | 8/2007 | Wu et al. | 345/166 |

* cited by examiner

*Primary Examiner*—Que T Le
*Assistant Examiner*—Jennifer Bennett
(74) *Attorney, Agent, or Firm*—Rosenberg Klein & Lee (57) ABSTRACT

A motion-detecting module for combining a light-emitting function and a light-sensing function together includes a chip unit, a cover unit, and a light-guiding unit. The chip unit has a PCB, a light-emitting chip, and an image-sensing chip, and both the light-emitting chip and the image-sensing chip are electrically disposed on the PCB. The cover unit covers the light-emitting chip and the image-sensing chip. The cover unit has a receiving space for communicating the light-emitting chip and the image-sensing chip, a first opening for exposing the light-emitting chip, and a second opening for exposing the image-sensing chip. The light-guiding unit is disposed under the cover unit, and the light-guiding unit at least has a first refraction surface, a second refraction surface, a third refraction surface, a fourth refraction surface, and a reflection surface.

8 Claims, 8 Drawing Sheets

MOTION-DETECTING MODULE FOR COMBINING A LIGHT-EMITTING FUNCTION AND A LIGHT-SENSING FUNCTION TOGETHER

BACKGROUND OF THE INVENTION

1. Field of the Invention

The present invention relates to a motion-detecting module, and particularly relates to a motion-detecting module for combining a light-emitting function and a light-sensing function together.

2. Description of the Related Art

Figure 1:
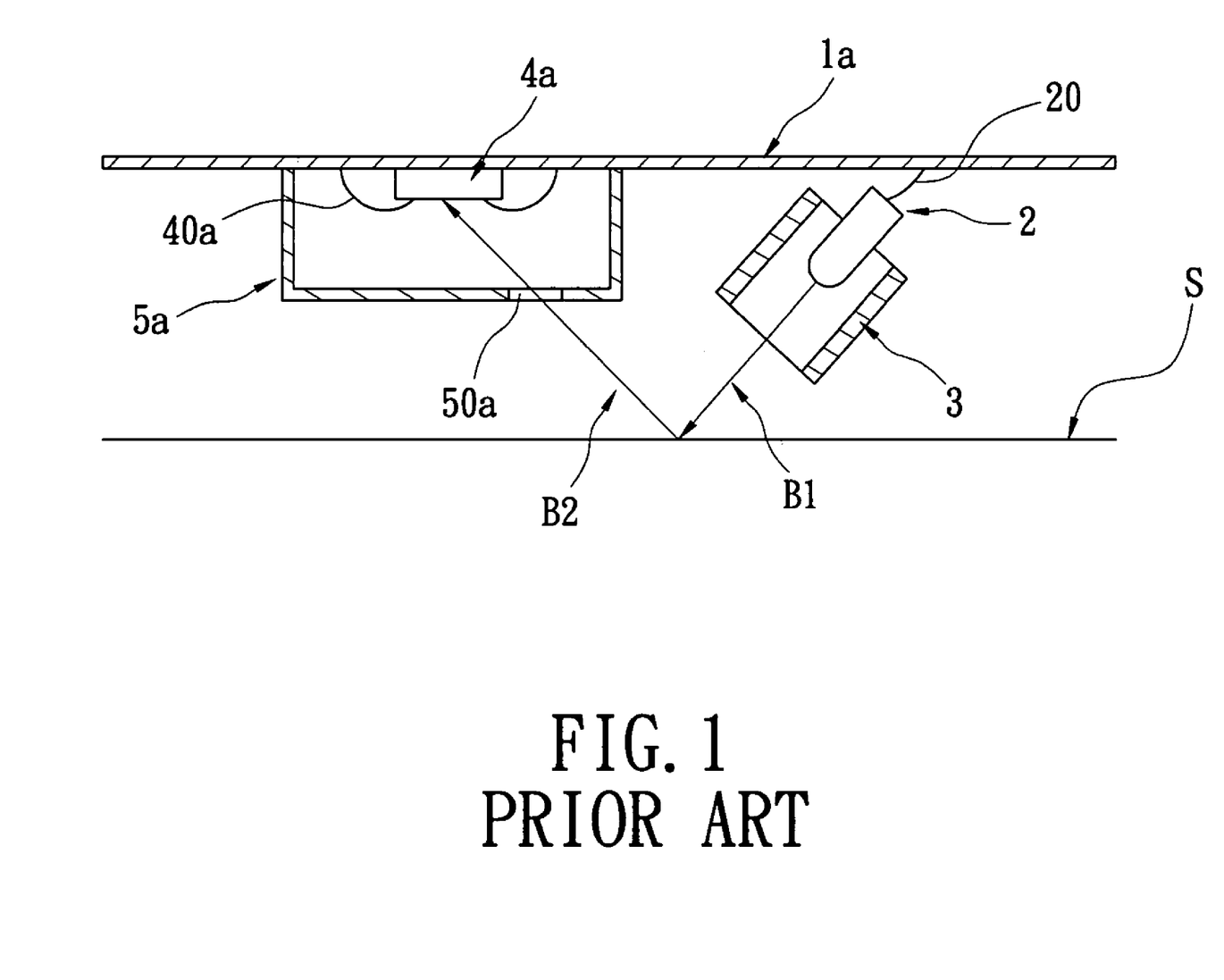
FIG. 1 is a cross-sectional, schematic view of an image-sensing device of the prior art.

FIG. 1 shows a cross-sectional, schematic view of an image-sensing device of the prior art. The image-sensing device of the prior art includes a main PCB 1a, a light-emitting element 2, an illuminant-fixing mechanism 3, an image-sensing element 4a, and a package casing 5a.

The light-emitting element 2 is fixed on the illuminant-fixing mechanism 3 and is electrically connected with the main PCB 1a via a leading wire 20. Moreover, the image-sensing element 4a is disposed on the main PCB 1a and is electrically connected with the main PCB 1a via a plurality of leading wire 40a. Furthermore, the package casing 5a is cover on the image-sensing element 4a and has an opening hole 50a for exposing the image-sensing element 4a. Therefore, the light-emitting element 2 generates a beam B1 onto a surface S to form a reflected beam B2, and the reflected beam B2 is projected onto the image-sensing element 4a through the opening hole 50a for sensing the image of the surface S.

However, the light-emitting element 2 and the image-sensing element 4a are separated from each other. The relationship between the light-emitting element 2 and the image-sensing element 4a needs to be adjusted accurately, so that the image-sensing element 4a can accurately sense the reflected beam B2. Hence, the prior art leads to a complex manufacturing process with large tolerances. Besides, the illuminant-fixing mechanism 3 and the package casing 5a are separated from each other, so that the manufacturing cost of the prior art is high.

In other words, it is difficult to precisely position the light-emitting element 2 and the image-sensing element 4a on the main PCB 1a, and alternatively, a light-guiding device (not shown) for the image-sensing device has a large assembling tolerance, so that the judgment capability of the image-sensing device would be affected.

SUMMARY OF THE INVENTION

One particular aspect of the present invention is to provide a motion-detecting module for combining a light-emitting function and a light-sensing function together. The motion-detecting module has a light-emitting chip and an image-sensing chip separately embedded in the same PCB. Moreover, the present invention uses a total internal reflection type light-guiding element for guiding beams from the light-emitting chip to the image-sensing chip.

In order to achieve the above-mentioned aspects, the present invention provides a motion-detecting module for combining a light-emitting function and a light-sensing function together, including: a chip unit, a cover unit, and a light-guiding unit.

Moreover, the chip unit has a PCB (Printed Circuit Board), a light-emitting chip, and an image-sensing chip, and both the light-emitting chip and the image-sensing chip are electrically disposed on the PCB. The cover unit covers the light-emitting chip and the image-sensing chip. The cover unit has a receiving space for communicating the light-emitting chip and the image-sensing chip, a first opening for exposing the light-emitting chip, and a second opening for exposing the image-sensing chip. The light-guiding unit is disposed under the cover unit, and the light-guiding unit at least has a first refraction surface, a second refraction surface, a third refraction surface, a fourth refraction surface, and a reflection surface.

Therefore, beams projected from the light-emitting chip pass through the first refraction surface, the reflection surface and the second refraction surface to form first reflected beams that project onto a surface, and the first reflected beams are reflected by the surface to form second reflected beams that pass through the third refraction surface and the fourth refraction surface and project onto the image-sensing chip.

Hence, the light-emitting chip and the image-sensing chip are separately embedded in the same PCB and the present invention uses the total internal reflection type light-guiding element for guiding beams from the light-emitting chip to the image-sensing chip, so that the manufacturing cost is reduced and the assembling yield is increased in the present invention.

It is to be understood that both the foregoing general description and the following detailed description are exemplary, and are intended to provide further explanation of the invention as claimed. Other advantages and features of the invention will be apparent from the following description, drawings and claims.

BRIEF DESCRIPTION OF THE DRAWINGS

The various objects and advantages of the present invention will be more readily understood from the following detailed description when read in conjunction with the appended drawings, in which.

DETAILED DESCRIPTION OF THE PREFERRED EMBODIMENTS

Figure 2:
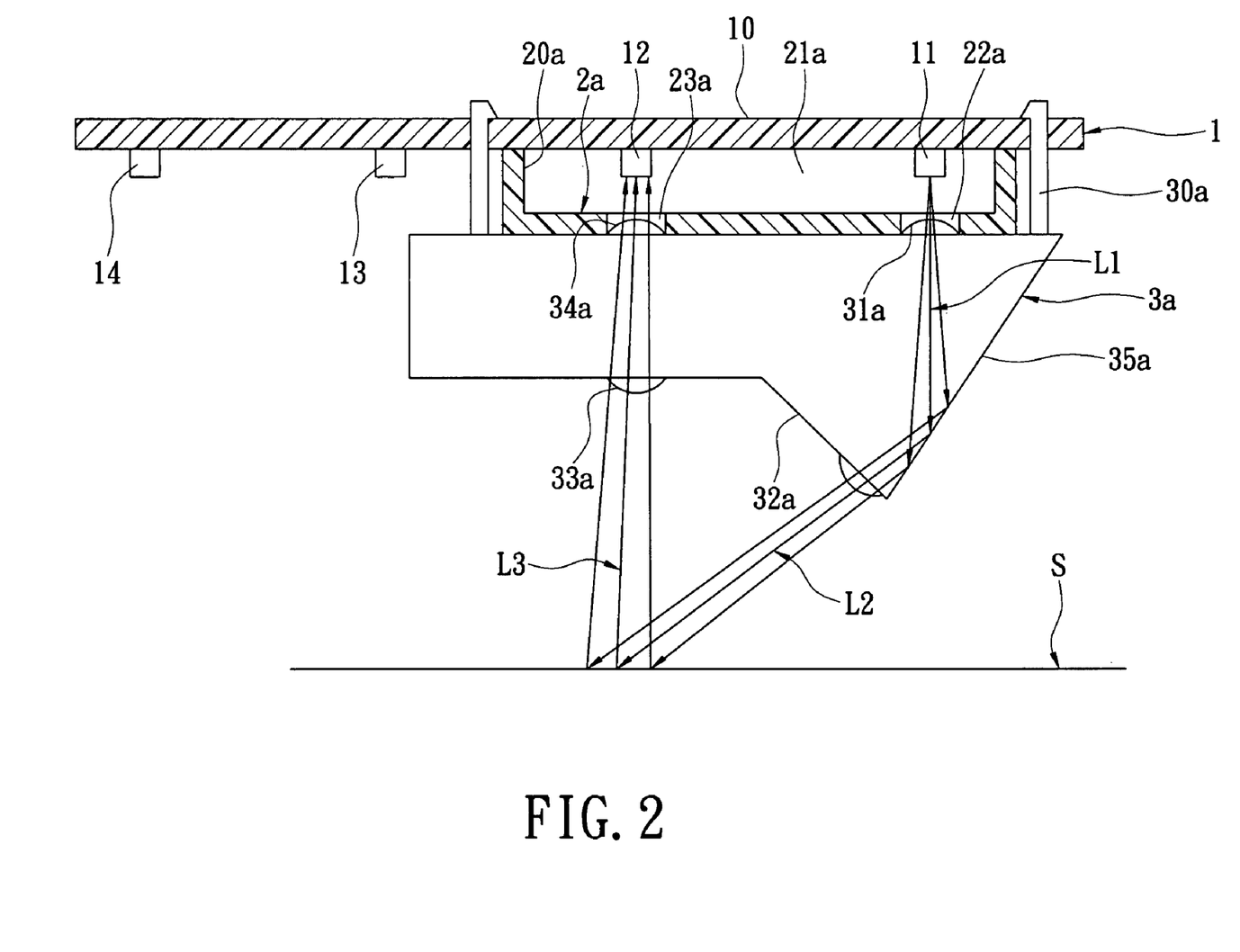
FIG. 2 is a cross-sectional, schematic view of a motion-detecting module for combining a light-emitting function and a light-sensing function together according to the first embodiment of the present invention.

FIG. 2 shows a cross-sectional, schematic view of a motion-detecting module for combining a light-emitting function and a light-sensing function together according to the first embodiment of the present invention. The first embodiment of the present invention provides a motion-detecting module for combining a light-emitting function and a light-sensing function together, including a chip unit 1, a cover unit 2a, and a light-guiding unit 3a.

The chip unit 1 has a PCB (Printed Circuit Board) 10, a light-emitting chip 11, an image-sensing chip 12, a motion calculator ASIC (Application Specific Integrated Circuit) 13, and an interfacing MCU (Microprocessor Control Unit) 14 for communicating with external systems (not shown). In addition, the light-emitting chip 11, the image-sensing chip 12, the motion calculator ASIC 13, and the interfacing MCU 14 are electrically disposed on the PCB 10, respectively.

Moreover, the cover unit 2a is positioned on the PCB 10 of the chip unit 1, and the cover unit 2a has a cover body 20a extended upwardly from an external edge thereof in order to cover the light-emitting chip 11 and the image-sensing chip 12. Hence, the cover unit 2a uses cover body 20a to cover over the light-emitting chip 11 and the image-sensing chip 12. In addition, the cover unit 2a has a receiving space 21a for communicating the light-emitting chip 11 and the image-sensing chip 12, a first opening 22a for exposing the light-emitting chip 11, and a second opening 23a for exposing the image-sensing chip 12.

Furthermore, the light-guiding unit 3a is disposed under the cover unit 2a, and the light-guiding unit 3a has a plurality of positioning elements 30a. Hence, the light-guiding unit 3a is positioned on the PCB 10 of the chip unit 1 via the positioning elements 30a. Moreover, the light-guiding unit 3a at least has a first refraction surface 31 a, a second refraction surface 32a, a third refraction surface 33a, a fourth refraction surface 34a, and a reflection surface 35a.

In addition, in the first embodiment, the light-guiding unit 3a is a total internal reflection type light-guiding element, and the refractive index of the total internal reflection type light-guiding element is higher than the refractive index of air. Moreover, the first refraction surface 31a, the second refraction surface 32a, the third refraction surface 33a, and the fourth refraction surface 34a are convex structures.

Therefore, beams L1 projected from the light-emitting chip 11 pass through the first refraction surface 31a, the reflection surface 35a and the second refraction surface 32a to form first reflected beams L2 that project onto a surface S, and the first reflected beams L2 are reflected by the surface S to form second reflected beams L3 that pass through the third refraction surface 33a and the fourth refraction surface 34a and project onto the image-sensing chip 12.

Figure 3:
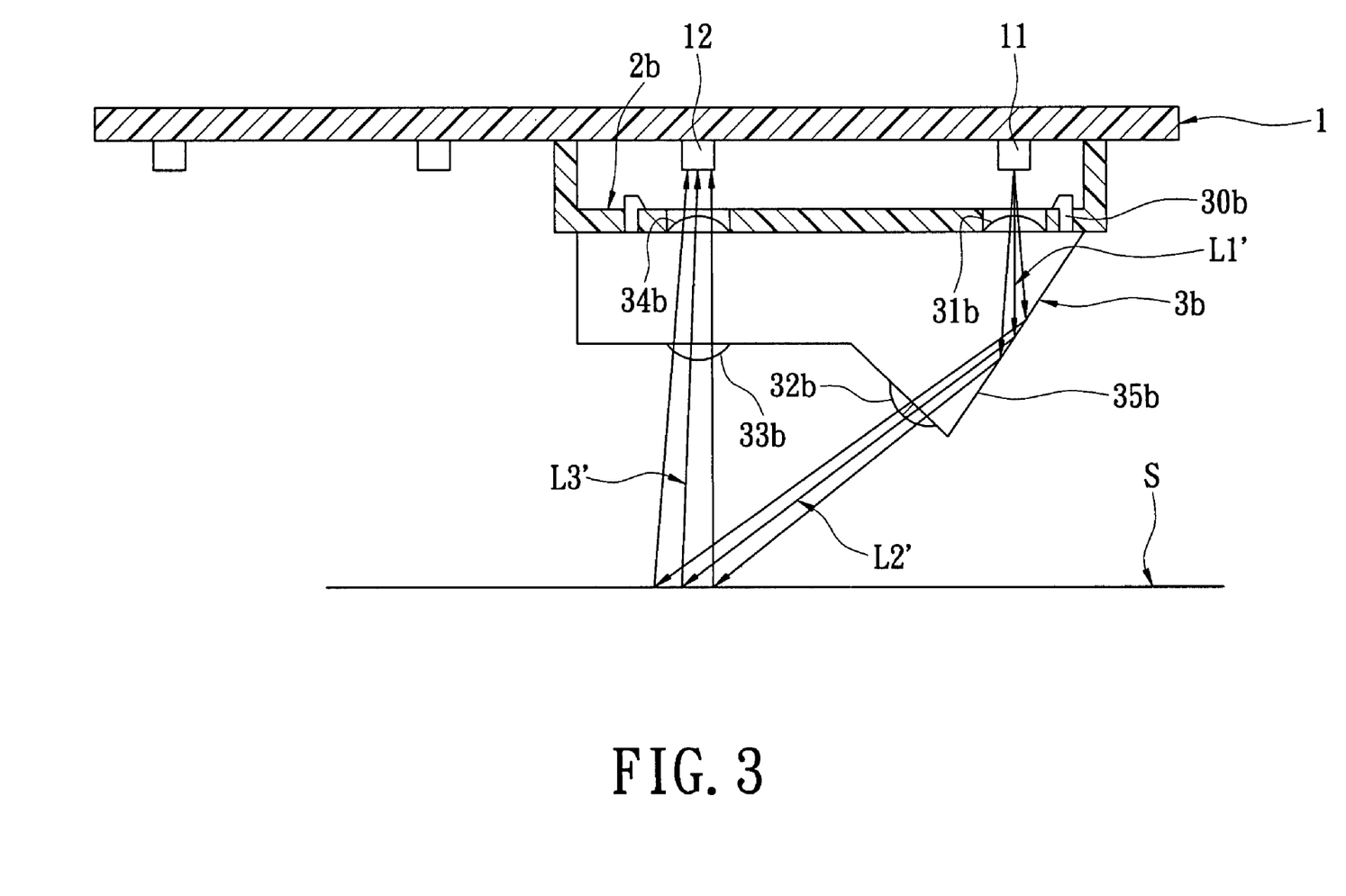
FIG. 3 is a cross-sectional, schematic view of a motion-detecting module for combining a light-emitting function and a light-sensing function together according to the second embodiment of the present invention.

FIG. 3 shows a cross-sectional, schematic view of a motion-detecting module for combining a light-emitting function and a light-sensing function together according to the second embodiment of the present invention. The difference between the second embodiment and the first embodiment is that: the motion-detecting module of the second embodiment includes a light-guiding unit 3b. Moreover, the light-guiding unit 3b has a plurality of positioning elements 30b. Hence, the light-guiding unit 3b is positioned on the cover unit 2b via the positioning elements 30b.

Therefore, beams L1' projected from the light-emitting chip 11 pass through the first refraction surface 31b, the reflection surface 35b and the second refraction surface 32b to form first reflected beams L2' that project onto a surface S, and the first reflected beams L2' are reflected by the surface S to form second reflected beams L3' that pass through the third refraction surface 33b and the fourth refraction surface 34b and project onto the image-sensing chip 12.

Figure 4:
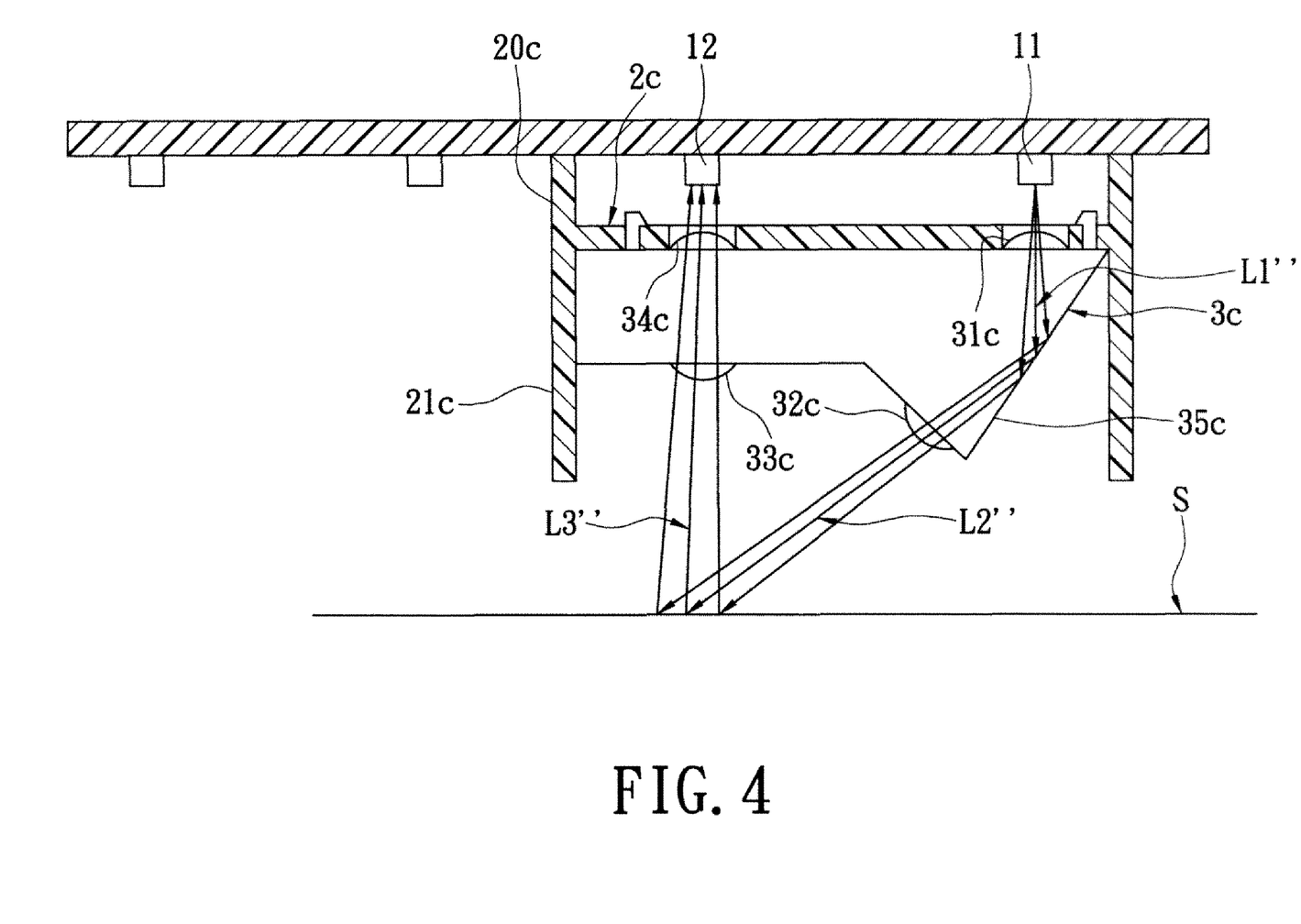
FIG. 4 is a cross-sectional, schematic view of a motion-detecting module for combining a light-emitting function and a light-sensing function together according to the third embodiment of the present invention.

FIG. 4 shows a cross-sectional, schematic view of a motion-detecting module for combining a light-emitting function and a light-sensing function together according to the third embodiment of the present invention. The difference between the third embodiment and the second embodiment is that: the motion-detecting module of the third embodiment includes a cover unit 2c. Moreover, the cover unit 2c has a top cover body 20c extended upwardly from an external edge thereof in order to cover the light-emitting chip 11 and the image-sensing chip 12 and a bottom cover body 21c extended downwardly from the external edge thereof in order to surround the light-guiding unit 13.

Therefore, beams L1" projected from the light-emitting chip 11 pass through the first refraction surface 31c, the reflection surface 35c and the second refraction surface 32c to form first reflected beams L2" that project onto a surface S, and the first reflected beams L2" are reflected by the surface S to form second reflected beams L3" that pass through the third refraction surface 33c and the fourth refraction surface 34c and project onto the image-sensing chip 12.

Furthermore, because the bottom cover body 21c of the third embodiment is used to cover and shield the light-guiding unit 3c the light-guiding unit 3c cannot receive outside stray light. In other words, when the transmission process from the light-emitting chip 11 to the image-sensing chip 12 (from the beams L1" to the first reflected beams L2" and the first reflected beams L2"), the motion-detecting module of the third embodiment can prevent the light-guiding unit 3c from being effected by outside stray light in order to increase the image-detecting quality of the motion-detecting module of the present invention.

Figure 5:
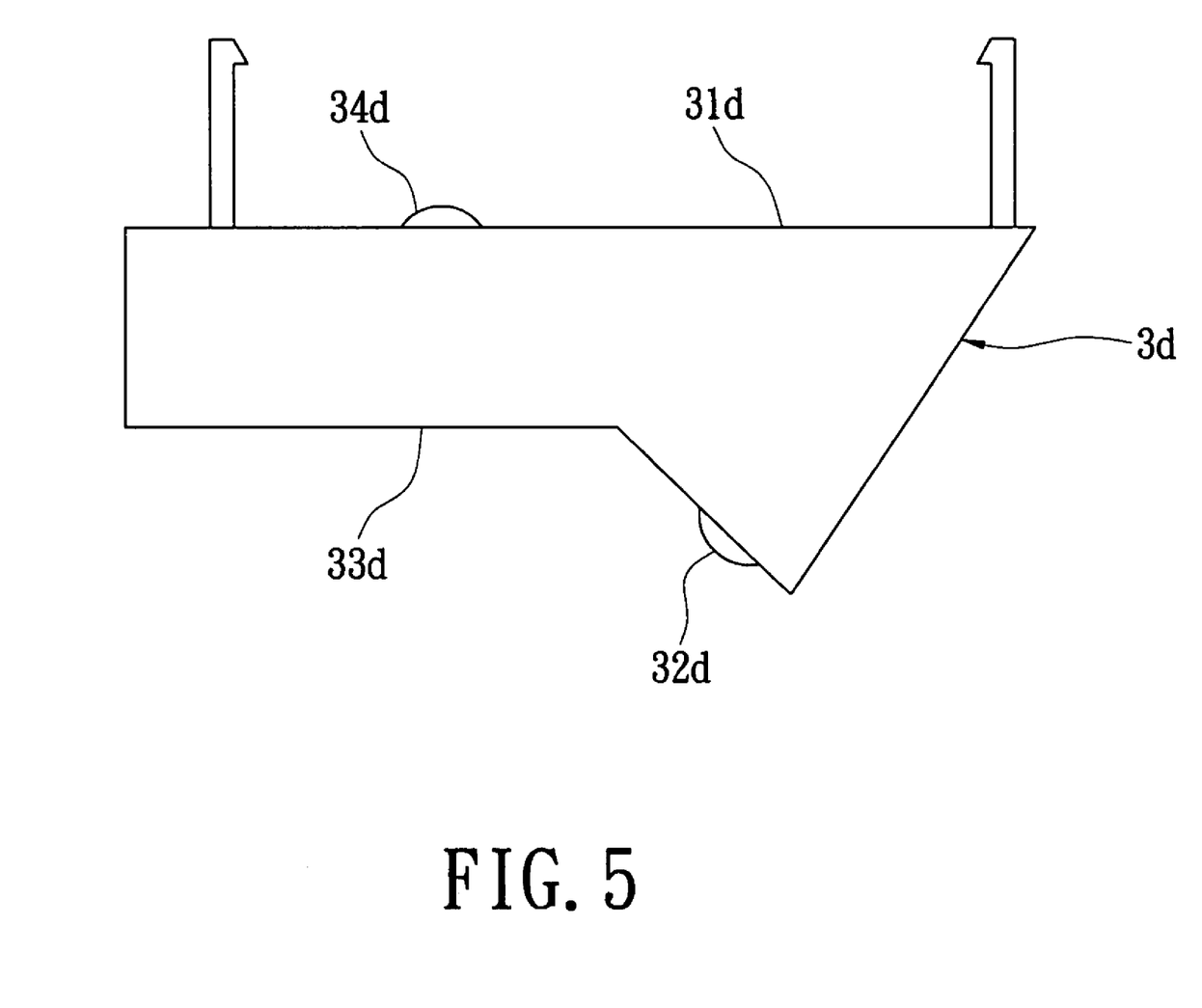
FIG. 5 is a side, schematic view of a light-guiding unit according to the fourth embodiment of the present invention.

FIG. 5 shows a side, schematic view of a light-guiding unit according to the fourth embodiment of the present invention. The difference between the fourth embodiment and the first embodiment is that: in the fourth embodiment, a light-guiding unit 3d has a first refraction surface 31 d, a second refraction surface 32d, a third refraction surface 33d, and a fourth refraction surface 34d. In addition, the first refraction surface 31d is a plane structure, the second refraction surface 32d is a convex structure, the third refraction surface 33d is a plane structure, and the fourth refraction surface 34d is a convex structure.

Figure 6:
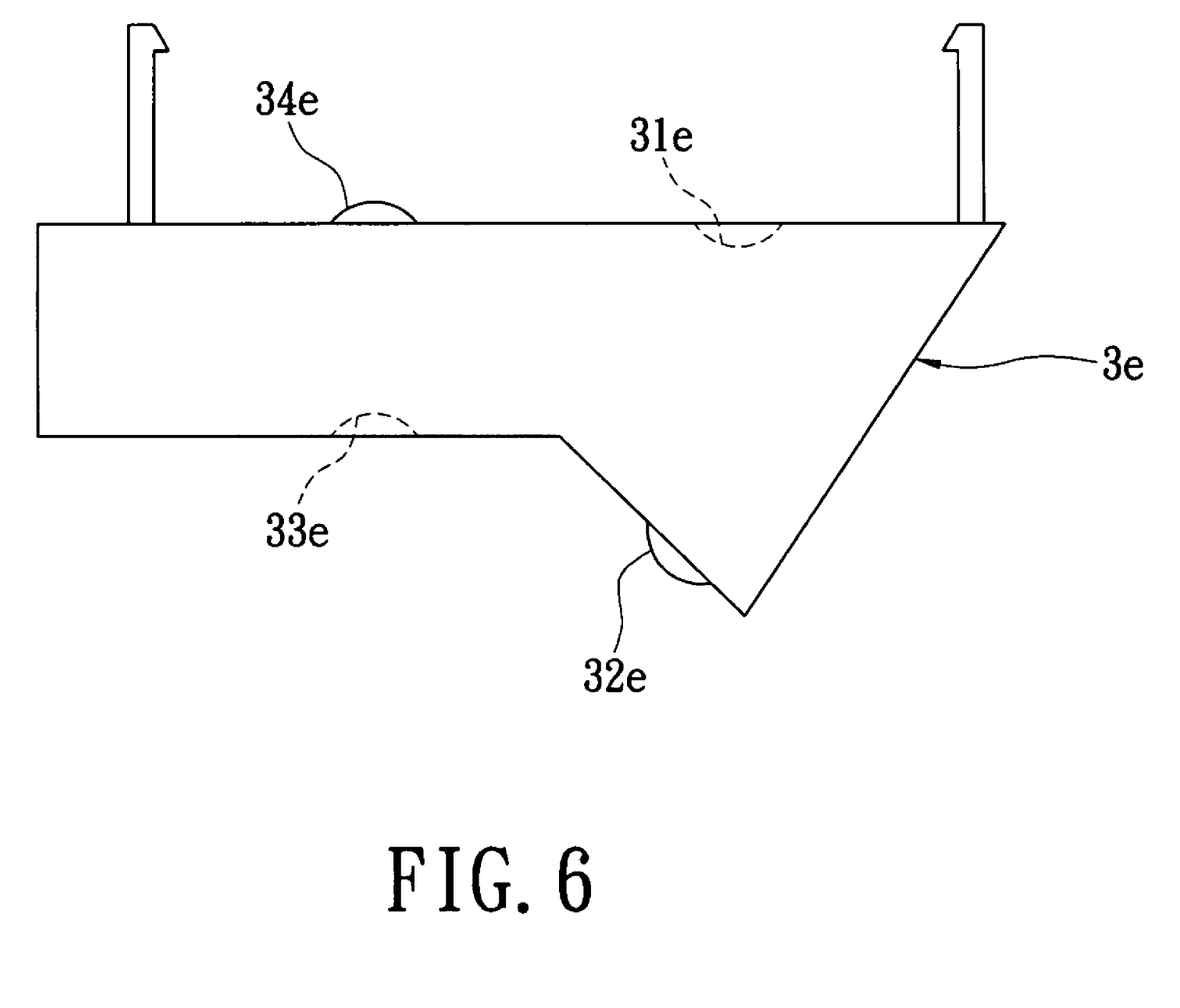
FIG. 6 is a side, schematic view of a light-guiding unit according to the fifth embodiment of the present invention.

FIG. 6 shows a side, schematic view of a light-guiding unit according to the fifth embodiment of the present invention. The difference between the fifth embodiment and the first embodiment is that: in the fifth embodiment, a light-guiding unit 3e has a first refraction surface 31e, a second refraction surface 32e, a third refraction surface 33e, and a fourth refraction surface 34e. In addition, the first refraction surface 31e is a concave structure, the second refraction surface 32e is a convex structure, the third refraction surface 33e is a concave structure, and the fourth refraction surface 34e is a convex structure.

Figure 7:
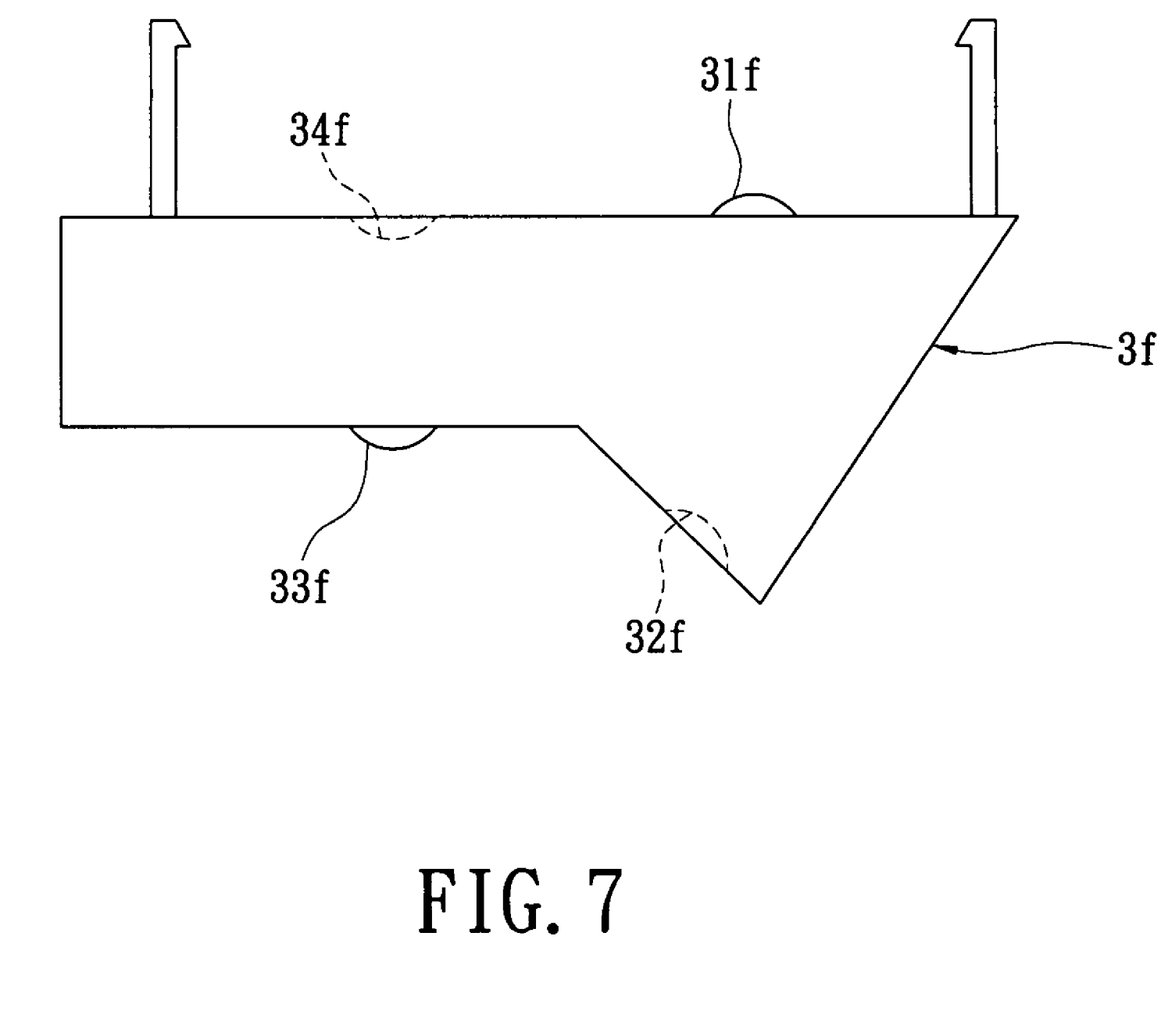
FIG. 7 is a side, schematic view of a light-guiding unit according to the sixth embodiment of the present invention.

FIG. 7 shows a side, schematic view of a light-guiding unit according to the sixth embodiment of the present invention. The difference between the sixth embodiment and the first embodiment is that: in the sixth embodiment, a light-guiding unit 3f has a first refraction surface 31f, a second refraction surface 32f, a third refraction surface 33f, and a fourth refraction surface 34f. In addition, the first refraction surface 31f is a convex structure, the second refraction surface 32f is a concave structure, the third refraction surface 33f is a convex structure, and the fourth refraction surface 34f is a concave structure.

Figure 8:
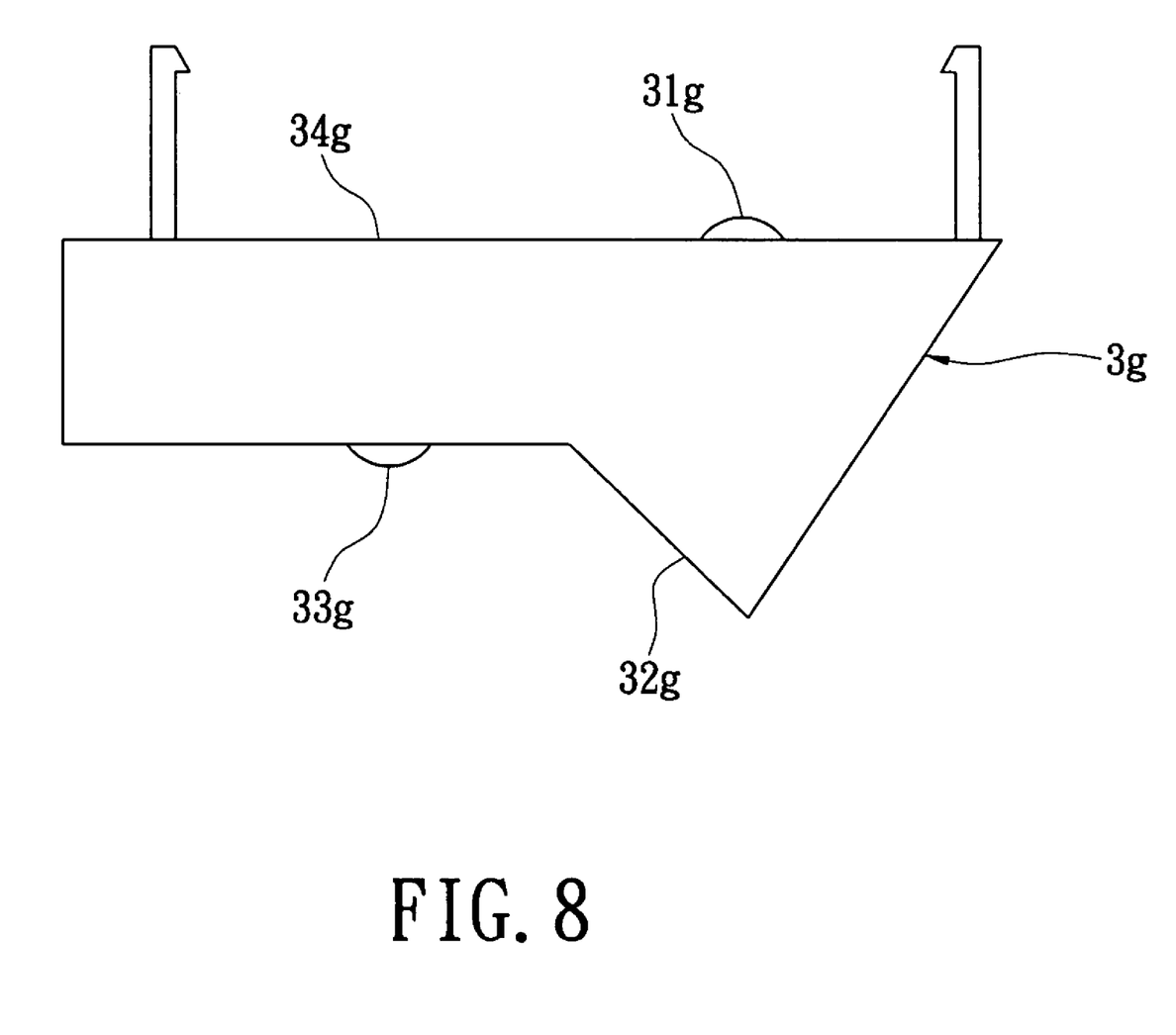
FIG. 8 is a side, schematic view of a light-guiding unit according to the seventh embodiment of the present invention.

FIG. 8 shows a side, schematic view of a light-guiding unit according to the seventh embodiment of the present invention. The difference between the seventh embodiment and the first embodiment is that: in the seventh embodiment, a light-guiding unit 3g has a first refraction surface 31g, a second refraction surface 32g, a third refraction surface 33g, and a fourth refraction surface 34g. In addition, the first refraction surface 31g is a convex structure, the second refraction surface 32g is a plane structure, the third refraction surface 33g is a convex structure, and the fourth refraction surface 34g is a plane structure.

Hence, the five combinations of the first refraction surface and the second refraction surface can be plane-convex, concave-convex, convex-convex, convex-concave, and convex-plane according to the first and fourth to seventh embodiments (as shown in FIGS. 1, and 5-8). In addition, the five combinations of the third refraction surface and the fourth refraction surface can be plane-convex, concave-convex, convex-convex, convex-concave, and convex-plane according to the first and fourth to seventh embodiments (as shown in FIGS. 1, and 5-8).

In conclusion, the light-emitting chip 11 and the image-sensing chip 12 are separately embedded in the same PCB 10 and the present invention uses the total internal reflection type light-guiding element (such as the light-guiding units 3a, 3b, 3c, 3d, 3e, 3f, 3g) for guiding beams (such as the beams L1, L1', L1") from the light-emitting chip 11 to the image-sensing chip 12, so that the manufacturing cost is reduced and the assembling yield is increased in the present invention.

Although the present invention has been described with reference to the preferred best molds thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A motion-detecting module for combining a light-emitting function and a light-sensing function together, comprising:
   a chip unit having a PCB (Printed Circuit Board), a light-emitting chip, and an image-sensing chip, wherein both the light-emitting chip and the image-sensing chip are electrically disposed on the PCB;
   a cover unit covering the light-emitting chip and the image-sensing chip, wherein the cover unit has a receiving space for communicating the light-emitting chip and the image-sensing chip, a first opening for exposing the light-emitting chip, and a second opening for exposing the image-sensing chip; and
   a singular light-guiding unit disposed under the cover unit, wherein the light-guiding unit at least has a first refraction surface, a second refraction surface, a third refraction surface, a fourth refraction surface, and a flat reflection surface, wherein the light-guiding unit has a plurality of positioning elements, and the light-guiding unit is fixed under the cover unit by the positioning elements;
   wherein, beams projected from the light-emitting chip pass through the first refraction surface, the flat reflection surface and the second refraction surface to form first reflected beams that project onto a surface, wherein all of said beams impinging on said flat reflection surface are reflected to said second refraction surface; and the first reflected beams are reflected by the surface to form second reflected beams that pass through the third refraction surface and the fourth refraction surface and project onto the image-sensing chip; wherein said beams projected from the light-emitting chip undergo only one reflection within said singular light-guiding unit;
   wherein the cover unit has a top cover body extended upwardly from an external edge thereof in order to cover the light-emitting chip and the image-sensing chip and a bottom cover body extended downwardly from the external edge thereof in order to surround the light-guiding unit.

2. The motion-detecting module as claimed in claim 1, wherein the chip unit has a motion calculator ASIC (Application Specific Integrated Circuit) and an interfacing MCU (Microprocessor Control Unit) for communicating with external systems, and both the motion calculator ASIC and the interfacing MCU are electrically disposed on the PCB.

3. The motion-detecting module as claimed in claim 1, wherein the cover unit is positioned on the PCB of the chip unit.

4. The motion-detecting module as claimed in claim 1, wherein the cover unit has a cover body extended upwardly from an external edge thereof in order to cover the light-emitting chip and the image-sensing chip.

5. The motion-detecting module as claimed in claim 1, wherein the light-guiding unit is positioned on the PCB of the chip unit.

6. The motion-detecting module as claimed in claim 1, wherein the light-guiding unit is a total internal reflection type light-guiding element, and the refractive index of the total internal reflection type light-guiding element is higher than the refractive index of air.

7. The motion-detecting module as claimed in claim 1, wherein the first refraction surface is a concave structure, a plane structure or a convex structure, and the second refraction surface is a concave structure, a plane structure or a convex structure.

8. The motion-detecting module as claimed in claim 1, wherein the third refraction surface is a concave structure, a plane structure or a convex structure, and the fourth refraction surface is a concave structure, a plane structure or a convex structure.

* * * * *